United States Patent
Su et al.

(10) Patent No.: US 9,087,596 B2
(45) Date of Patent: Jul. 21, 2015

(54) GATE DRIVING CIRCUIT ON ARRAY APPLIED TO CHARGE SHARING PIXEL

(75) Inventors: Kuo-Chang Su, Hsin-Chu (TW); Yung-Chih Chen, Hsin-Chu (TW); Yu-Chung Yang, Hsin-Chu (TW); Chih-Ying Lin, Hsin-Chu (TW)

(73) Assignee: AU OPTRONICS CORP., Hsinchu (TW)

( * ) Notice: Subject to any disclaimer, the term of this patent is extended or adjusted under 35 U.S.C. 154(b) by 885 days.

(21) Appl. No.: 13/204,003

(22) Filed: Aug. 5, 2011

(65) Prior Publication Data

US 2012/0153996 A1 Jun. 21, 2012

(30) Foreign Application Priority Data

Dec. 16, 2010 (TW) ................................ 99144245 A

(51) Int. Cl.
G09G 3/36 (2006.01)
G11C 19/28 (2006.01)
(52) U.S. Cl.
CPC .............. *G11C 19/28* (2013.01); *G09G 3/3659* (2013.01); *G09G 3/3677* (2013.01); *G09G 2300/0447* (2013.01); *G09G 2330/023* (2013.01)
(58) Field of Classification Search
CPC G09G 3/3659; G09G 3/3677; G09G 2330/23
See application file for complete search history.

(56) References Cited

U.S. PATENT DOCUMENTS

| 7,342,568 | B2 * | 3/2008 | Wei et al. | 345/100 |
|---|---|---|---|---|
| 7,830,354 | B2 * | 11/2010 | Kim | 345/100 |
| 8,014,488 | B2 * | 9/2011 | Jang | 377/64 |
| 8,208,598 | B2 * | 6/2012 | Tsai et al. | 377/64 |
| 8,253,680 | B2 * | 8/2012 | Jang et al. | 345/100 |
| 2005/0008114 | A1 * | 1/2005 | Moon | 377/64 |
| 2005/0212746 | A1 * | 9/2005 | Iwasaki et al. | 345/100 |
| 2007/0146289 | A1 * | 6/2007 | Lee et al. | 345/100 |
| 2007/0147573 | A1 * | 6/2007 | Tobita et al. | 377/64 |
| 2007/0217564 | A1 * | 9/2007 | Tobita | 377/64 |
| 2007/0297559 | A1 * | 12/2007 | Cho et al. | 377/64 |
| 2009/0041177 | A1 * | 2/2009 | Chien et al. | 377/64 |
| 2009/0304138 | A1 * | 12/2009 | Tsai et al. | 377/79 |
| 2010/0060619 | A1 * | 3/2010 | Kim et al. | 345/205 |
| 2010/0134234 | A1 * | 6/2010 | Liao et al. | 337/75 |
| 2010/0150302 | A1 * | 6/2010 | Tsai et al. | 377/79 |
| 2010/0150303 | A1 * | 6/2010 | Tsai et al. | 377/79 |
| 2010/0166136 | A1 * | 7/2010 | Tobita | 377/67 |
| 2010/0201666 | A1 * | 8/2010 | Tobita | 345/208 |
| 2011/0002438 | A1 * | 1/2011 | Kim | 377/67 |
| 2011/0058642 | A1 * | 3/2011 | Tsai et al. | 377/79 |
| 2011/0228893 | A1 * | 9/2011 | Tobita et al. | 377/77 |
| 2011/0293063 | A1 * | 12/2011 | Tsai et al. | 377/79 |
| 2011/0317803 | A1 * | 12/2011 | Chiu et al. | 377/67 |
| 2012/0068989 | A1 * | 3/2012 | Jeon et al. | 345/211 |
| 2014/0093027 | A1 * | 4/2014 | Jang | 377/64 |

* cited by examiner

*Primary Examiner* — Kumar Patel
*Assistant Examiner* — Sejoon Ahn
(74) *Attorney, Agent, or Firm* — WPAT, PC; Justin King

(57) ABSTRACT

The disclosure provides a gate driving circuit on array applied to a display panel with charge sharing pixel structure. In particular, the gate driving circuit is adapted to receive multi-phase clock signal and includes a plurality of shift registers. Each shift register includes a driving circuit including a first driving transistor and a second driving transistor, a pull-down unit and at least one pull-up unit, so that is capable of generating mutually non-overlapped main gate driving signal and sub gate driving signal. Furthermore, the advantage of the disclosure is to provide a gate driving circuit with simplified circuit structure and circuit layout.

14 Claims, 13 Drawing Sheets

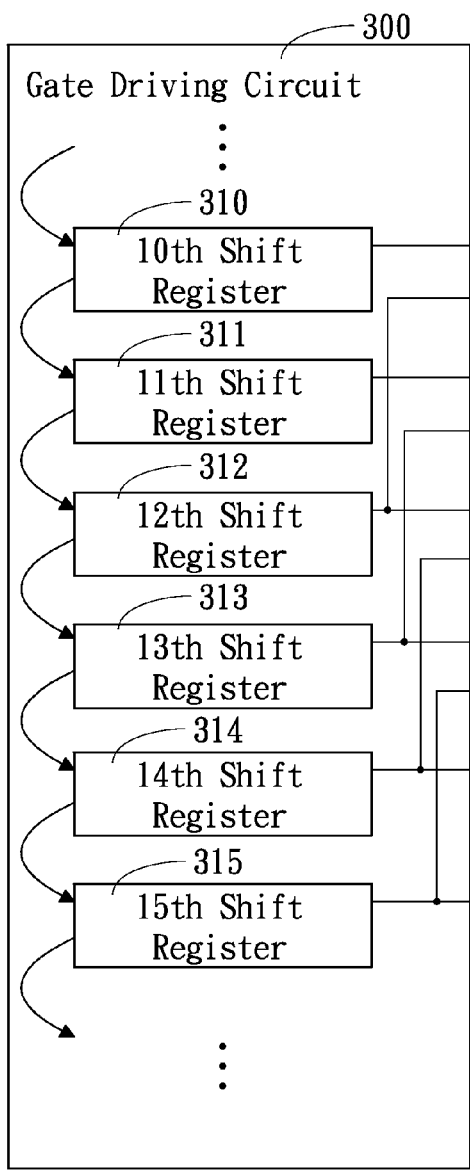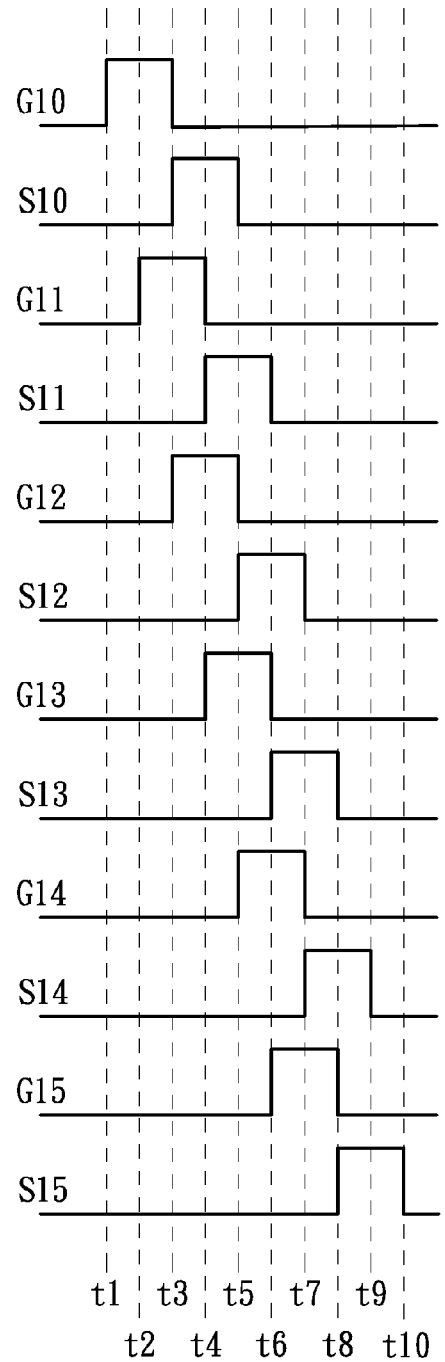
FIG. 3A
(Related Art)
FIG. 3B
(Related Art)

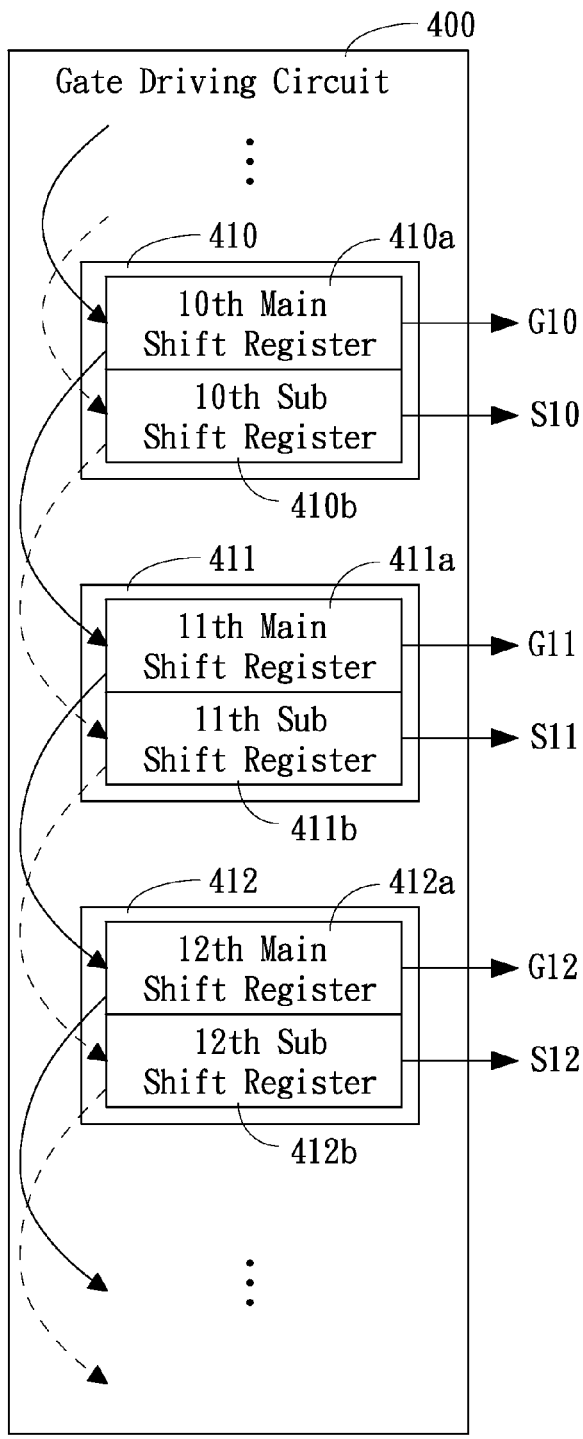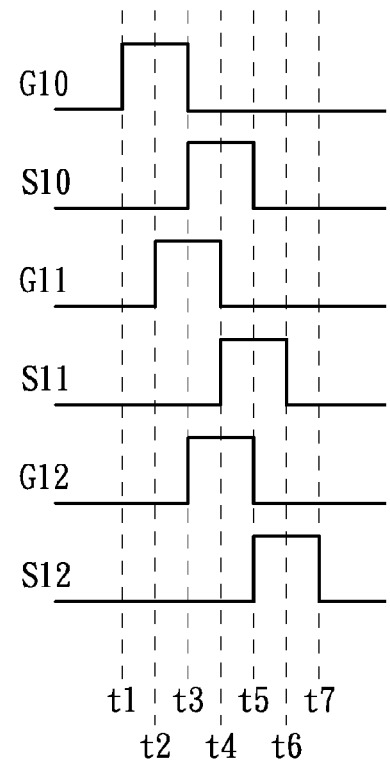
FIG. 4A
(Related Art)
FIG. 4B
(Related Art)

GATE DRIVING CIRCUIT ON ARRAY APPLIED TO CHARGE SHARING PIXEL

TECHNICAL FIELD

The disclosure generally relates to gate driving circuits, and more particularly to a gate driving circuit on array applied to a display panel with charge sharing pixel structure.

DESCRIPTION OF THE RELATED ART

FIG. 1A is a schematic circuit diagram of a single charge sharing pixel on a liquid crystal display (LCD) panel. As depicted in FIG. 1A, the charge sharing pixel 100 includes a main area 104 and a sub area 102. In particular, the charge sharing pixel 100 includes first through third switching transistors Qd1~Qd3 and multiple capacitors C1~C6. The charge sharing pixel 100 is electrically coupled to two gate lines and one data line. A first one of the gate lines is electrically coupled to receive a main gate driving signal Gn, a second one of the gate lines is electrically coupled to receive a sub gate driving signal Sn, and the data line is electrically coupled to receive a data signal Dn.

FIG. 1B is timing diagrams of the gate driving signals associated with the charge sharing pixel in FIG. 1A. During a duration between time points t1 and t2, the main gate driving signal Gn generates a pulse, the first switching transistor Qd1 and the second switching transistor Qd2 are turned on, the third switching transistor Qd3 is turned off, so that the data signal Dn on the data line is stored to the capacitors C1~C6 arranged in the main area 104 and the sub area 102.

During another duration between time points t2 and t3, the sub gate driving signal Sn generates a pulse, the third switching transistor Qd3 is turned on, the first switching transistor Qd1 and the second switching transistor Qd2 are turned off, so that charges stored in the capacitors C1, C2 in the sub area 102 would be delivered to the capacitors C3-C6 in the main area 104 for charge sharing. Hereto, the operation principle of the charge sharing pixel 100 is described as above.

It can be found from the above description, each charge sharing pixel 100 is needed to electrically couple with two gate lines, and the pulses of the gate driving signals Gn, Sn respectively on the two gate lines are necessarily non-overlapped with each other. Taking the illustration of FIG. 1B as an example, at any time point, the main gate driving signal Gn and the sub gate driving signal Sn would not be logic high level at the same time, so as to assure the charge sharing pixel 100 to normally operate.

In order to reduce the cost of LCD panel, a type of gate driver on array (abbreviated as GOA) has been widely used in the LCD panel, and such panel also is termed as GOA panel. That is, such GOA panel is directly manufactured with a gate driving circuit, so that the cost of gate driving circuit can be reduced.

FIG. 2A is a schematic circuit diagram of a gate driving circuit of a GOA panel. The gate driving circuit 200 includes multiple shift registers. Each of the shift registers is electrically coupled to receive multiple clock signals with different phases (e.g., a clock signal CK and an inverted clock signal XCK with a phase difference of 180 degrees therebetween). FIG. 2A only show three shift registers 20n−1, 20n and 20n+1 for the purpose of illustration.

Taking the nth shift register 20n as an example, the shift register 20n comprises a pull-up unit, a pull-down unit and a driving transistor T1. Generally speaking, when the (n−1)th control signal Qn−1 and the (n−1)th gate driving signal Gn−1 outputted from the (n−1)th shift register 20n−1 (i.e., the firstly preceding shift register) both are at logic low levels, the pull-up unit of the nth shift register 20n is not in operation while the pull-down unit is in operation, the nth control signal Qn is controlled to be maintained at a logic low level, the driving transistor T1 of the nth shift register 20n is turned off, and therefore an nth gate driving signal Gn is maintained at a logic low level.

Whereas, when the (n−1)th control signal Qn−1 and the (n−1)th gate driving signal Gn−1 outputted from the (n−1)th shift register 20n−1 both are at logic high levels, the pull-up unit of the nth shift register 20n starts to be in operation while the pull-down unit is stopped being in operation, the nth control signal Qn is controlled to be maintained at a logic high level, the driving transistor T1 of the nth shift register 20n is turned on, so that the nth gate driving signal Gn generates a pulse subjected to the control of clock signals CK, XCK.

Based on the above operation principle, the shift registers in the gate driving circuit 200 can sequentially generate gate driving signals to the GOA panel. Moreover, the shift registers in the gate driving circuit 200 are arranged from top to bottom, and correspondingly the gate driving signals are sequentially generated from top to bottom. It is understood that, the shift registers can be arranged from bottom to top instead, and correspondingly the gate driving signals would be sequentially generated from bottom to top.

In addition, since the gate driving circuit 200 on the GOA panel generally has a limited driving capability, the gate driving signals actually need to be overlapped with one another. FIG. 2B is timing diagrams of gate driving signals generated from the gate driving circuit on the conventional GOA panel in FIG. 2A. During a duration between time points t1 and t3, the (n−1)th gate driving signal Gn−1 generates a pulse. During a duration between time points t2 and t4, the nth gate driving signal generates a pulse. During a duration between time points t3 and t5, the (n+1)th gate driving signal Gn+1 generates a pulse.

In actual operation, the duration between the time points t1 and t2 is used as a pre-charge period of the (n−1)th gate driving signal Gn−1. That is, all the pixels receiving the (n−1)th gate driving signal Gn−1 on the GOA panel would not receive any data in the pre-charge period, and such pixels would receive data signals from data lines after entering a data period from the time point t2 to the time point t3. A time length of the pre-charge period is equal to that of the data period.

Similarly, the duration between the time points t2 and t3 is used as a pre-charge period of the nth gate driving signal Gn, and the duration between the time points t3 and t4 is used as a data period of the nth gate driving signal Gn. The duration between the time points t3 and t4 is used as a pre-charge period of the (n+1)th gate driving signal Gn+1, and the duration between the time points t4 and t5 is used as a data period of the (n+1)th gate driving signal Gn+1.

The gate driving circuit 200 as illustrated in FIGS. 2A, 2B and the gate driving signals associated therewith are suitably applied to general pixels. If the gate driving circuit is wanted to be applied to the charge sharing pixels, the condition of main gate driving signal and the sub gate driving signal would be non-overlapped with each other ought to be further taken in consideration, and relevant designs of the gate driving circuit 200 correspondingly are necessarily modified.

Referring to FIGS. 3A and 3B, are a schematic circuit diagram of a gate driving circuit applied to a GOA panel with charge sharing pixel structure and timing diagrams of associated gate driving signals. The gate driving circuit 300 includes multiple shift registers, and an operation principle thereof is similar to that associated with FIG. 2A, i.e., the preceding shift register would control the succeeding shift register to generate a gate driving signal, and detailed operation process will not be described herein. Moreover, FIG. 3A only shows $10^{th}$ through $15^{th}$ shift registers 310-315 for the purpose of illustration, and the other shift registers can be known based on the same design manner.

Clearly, the shift registers 310-315 can sequentially generate gate driving signals G10, G11, G12, G13, G14, G15, according to the respective preceding shift registers, as main gate driving signals. In order to generate sub gate driving signals non-overlapped with the respective main gate driving signals, the conventional gate driving circuit 300 takes the main gate driving signal of the secondly succeeding shift register as the sub gate driving signal of current staged shift register by trace layout.

Taking the $12^{th}$ shift register 312 as an example, the shift register 312 can generate the $12^{th}$ main gate driving signal G12, and the $12^{th}$ main gate driving signal G12 further can be used as the $10^{th}$ sub gate driving signal S10 by trace layout. Likewise, the $14^{th}$ main gate driving signal G14 can be used as the $12^{th}$ sub gate driving signal S12 by trace layout.

Accordingly, as illustrated in FIG. 3B, the $10^{th}$ main gate driving signal G10 generates a pulse from t1 to t3, and the $10^{th}$ sub gate driving signal S10 generates a pulse from t3 to t5. The $11^{th}$ main gate driving signal G11 generates a pulse from t2 to t4, and the $11^{th}$ sub gate driving signal S11 generates a pulse from t4 to t6. The $12^{th}$ main gate driving signal G12 generates a pulse from t3 to t5, and the $12^{th}$ sub gate driving signal S12 generates a pulse from t5 to t7. The $13^{th}$ main gate driving signal G13 generates a pulse from t4 to t6, and the $13^{th}$ sub gate driving signal S13 generates a pulse from t6 to t8. The $14^{th}$ main gate driving signal G14 generates a pulse from t5 to t7, and the $14^{th}$ sub gate driving signal S14 generates a pulse from t7 to t9. The $15^{th}$ main gate driving signal G15 generates a pulse from t6 to t8, and the $15^{th}$ sub gate driving signal S15 generates a pulse from t8 to t10.

However, the shift registers in the gate driving circuit 300 as illustrated in FIG. 3A have considerably large crossover wires, so that the trace layout of the GOA panel become more complex.

Referring to FIGS. 4A and 4B, are a schematic circuit diagram of a gate driving circuit applied to another GOA panel with charge sharing pixel structure and timing diagrams of associated gate driving signals. The gate driving circuit 400 includes multiple shift registers. Each of the shift register includes a main shift register and a sub shift register.

FIG. 4A only shows $10^{th}$ through $12^{th}$ shift registers 410-412 for the purpose of illustration, and the other shift registers can be known based on the same design manner. In particular, the main shift register in each of the shift registers is subjected to the control of the main shift register of the firstly preceding shift register to generate a main gate driving signal. Similarly, the sub shift register in each of the shift registers is subjected to the control of the sub shift register of the firstly preceding shift register to generate a sub gate driving signal. Moreover, the main shift register and the sub shift register in each of the shift register mutually have no control relationship.

It can be found from FIG. 4A, the $10^{th}$ main shift register 410a, the $11^{th}$ main shift register 411a and the $12^{th}$ main shift register 412a would sequentially generate the $10^{th}$ main gate driving signal G10, the $11^{th}$ main gate driving signal G11 and the $12^{th}$ main gate driving signal G12. Likewise, the $10^{th}$ sub shift register 410b, the $11^{th}$ sub shift register 411b and the $12^{th}$ sub shift register 412b would sequentially generate the $10^{th}$ sub gate driving signal S10, the $11^{th}$ sub gate driving signal S11 and the $12^{th}$ sub gate driving signal S12. As a result, mutually non-overlapped main gate driving signal and sub gate driving signal of each shift register can be generated.

However, the main shift register and the sub shift register generally have a same circuit structure, so that in FIG. 4A, the circuit structure of each of the shift register is more complex and occupies large layout area.

SUMMARY OF DISCLOSURE

Therefore, the disclosure is directed to a gate driving circuit applied to a display panel with charge sharing pixel structure. In particular, the gate driving circuit includes multiple shift registers, each of the shift registers can output mutually non-overlapped main gate driving signal and sub gate driving signal and achieve the advantages of simplified circuit structure and circuit layout.

More specifically, a gate driving circuit in accordance with an embodiment is adapted to receive multi-phase clock signals. The gate driving circuit includes multiple shift registers. An nth shift register in the shift registers includes a driving unit, a pull-up unit and a pull-down unit. The driving unit is subjected to the control of an nth control signal to output an nth main gate driving signal and an nth sub gate driving signal respectively according to a first clock signal and a second clock signal of the multi-phase clock signals. The pull-up unit is electrically coupled to receive a (n−2)th control signal and a (n−2)th main gate driving signal outputted from a (n−2)th shift register secondly preceding the nth shift register, and further electrically coupled to receive a third clock signal of the multi-phase clock signals. When the pull-up unit is in operation, the nth control signal is controlled to turn on the driving unit. The pull-down unit is electrically coupled to receive the nth control signal, the nth main gate driving signal and the nth sub gate driving signal. The pull-down unit is in operation after a predetermined time period of the pull-up unit starting to be in operation, to thereby control the nth control signal to turn off the driving unit. The third clock signal is phase-advanced with respect to the first clock signal, the first clock signal is phase-advanced with respect to the second clock signal, and the first clock signal, the second clock signal and the third clock signal are mutually non-overlapped with each other.

A gate driving circuit in accordance with another embodiment is adapted to receive multi-phase clock signals. The gate driving circuit includes multiple shift registers. An nth shift register in the shift registers includes a driving unit, a first pull-up unit, a second pull-up unit and a pull-down unit. The driving unit is subjected to the control of an nth control signal to output an nth main gate driving signal and an nth sub gate driving signal respectively according to a first clock signal and a second clock signal of the multi-phase clock signals. The first pull-up unit is electrically coupled to receive a (n−1)th control signal and a (n−1)th main gate driving signal outputted from a (n−1)th shift register firstly preceding the nth shift register, and further electrically coupled to receive a third clock signal of the multi-phase clock signals. When the first pull-up unit is in operation, the nth control signal is controlled to turn on the driving unit. The second pull-up unit is electrically coupled to a (n+1)th control signal and a (n+1)th main gate driving signal outputted from a (n+1)th shift register firstly succeeding the nth shift register, and further electrically coupled to receive a fourth clock signal of the multi-phase clock signals. When the second pull-up unit is in operation, the nth control signal is controlled to turn on the driving unit. The pull-down unit is electrically coupled to receive the nth control signal, the nth main gate driving signal and the nth sub gate driving signal. The pull-down unit is in operation after a predetermined time period of each of the first and second pull-up units starting to be in operation, to thereby control the nth control signal to turn off the driving unit. The third clock signal is phase-advanced with respect to the first clock signal, the first clock signal is phase-advanced with respect to the second clock signal, the fourth clock signal is phase-delayed with respect to the first clock signal, and the first clock signal and the second clock signal are mutually non-overlapped with each other.

BRIEF DESCRIPTION OF THE DRAWINGS

The above objectives and advantages will become more readily apparent to those ordinarily skilled in the art after reviewing the following detailed description and accompanying drawings.

FIGS. 3A and 3B are a schematic circuit diagram of a gate driving circuit applied to a conventional GOA panel with charge sharing pixel structure and timing diagrams of associated gate driving signals.

FIGS. 4A and 4B are a schematic circuit diagram of a gate driving circuit applied to another conventional GOA panel with charge sharing pixel structure and timing diagrams of associated gate driving signals.

DETAILED DESCRIPTION OF EMBODIMENTS

The disclosure will now be described more specifically with reference to the following embodiments. It is to be noted that the following descriptions of embodiments are presented herein for purpose of illustration and description only. It is not intended to be exhaustive or to be limited to the precise form disclosed.

According to the disclosure, a gate driving circuit on array (abbreviated as GOA) applied to a display panel with charge sharing pixel structure is provided, herein such display panel generally is termed as GOA panel. The gate driving circuit on the GOA panel includes multiple shift registers, each of the shift register can output mutually non-overlapped main gate driving signal and sub gate driving signal.

Figure 1A:
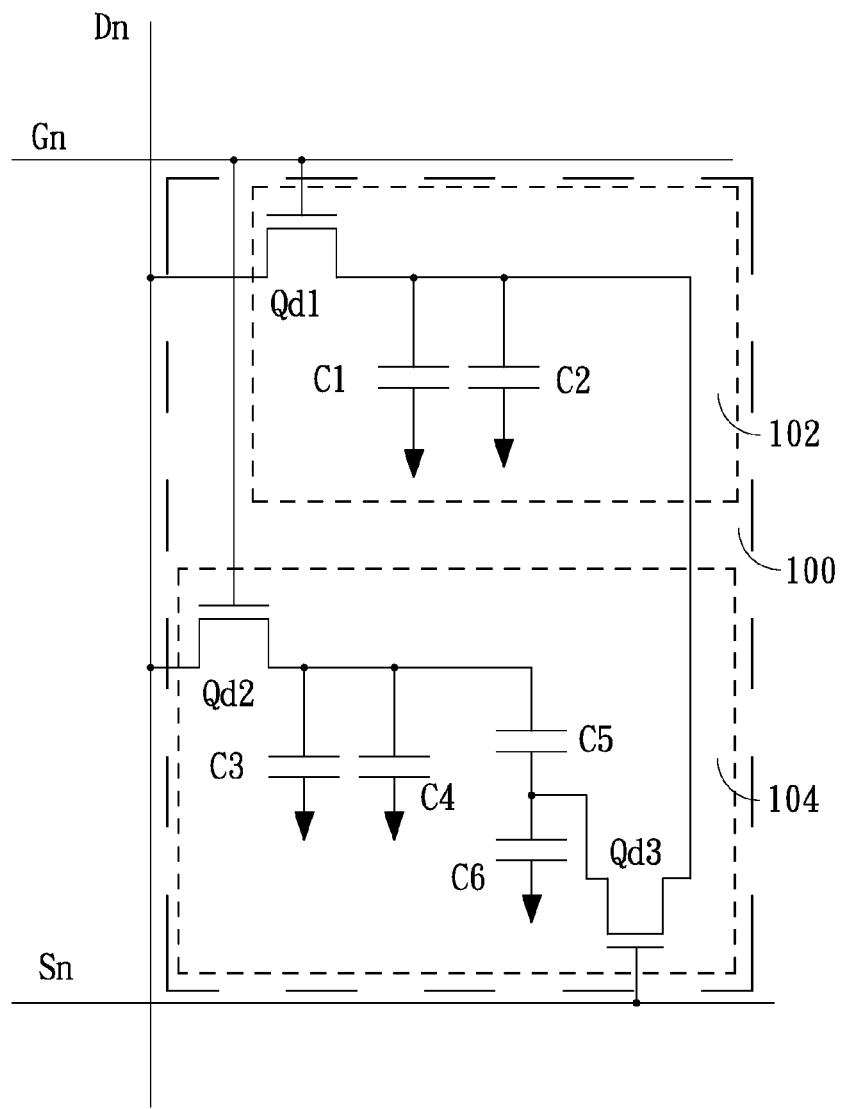
FIG. 1A is a schematic circuit diagram of a single charge sharing pixel on a conventional liquid crystal display panel.
Figure 1B:
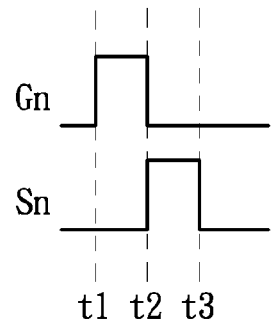
FIG. 1B is timing diagrams of the gate driving signals associated with the charge sharing pixel in FIG. 1A.
Figures 2A, 2B:
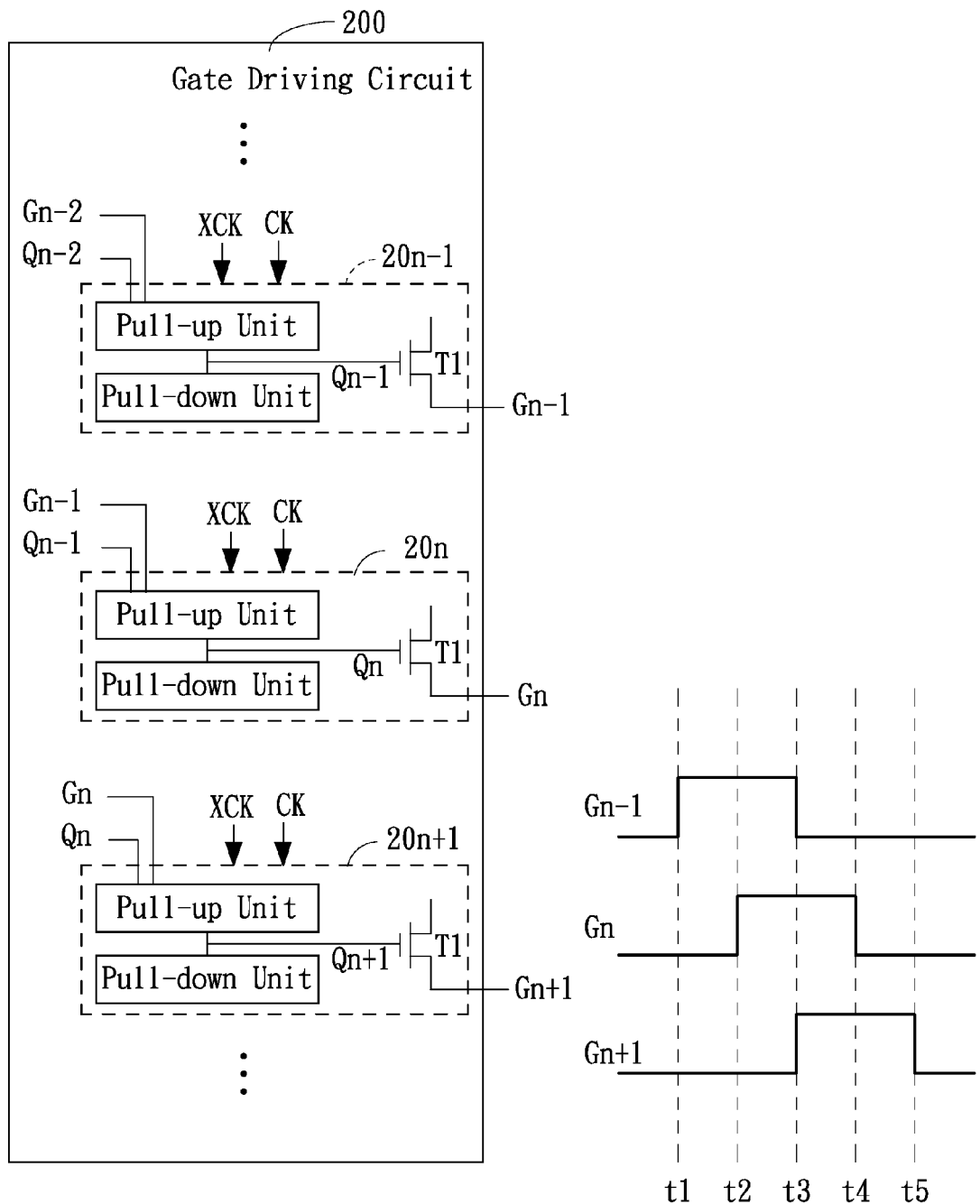
FIG. 2A is a schematic circuit diagram of a gate driving circuit of a conventional GOA panel.
FIG. 2B is timing diagrams of gate driving signals generated from a gate driving circuit on the conventional GOA panel in FIG. 2A.
Figure 5:
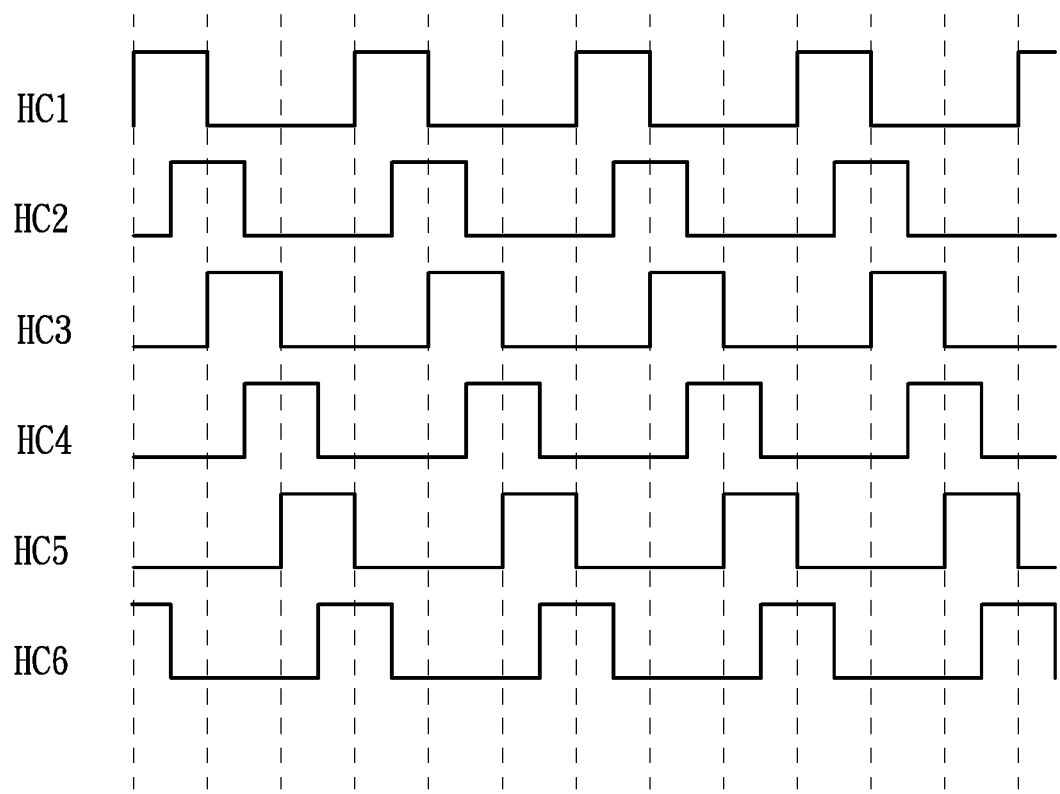
FIG. 5 is phase relationships among six-phase clock signals in accordance with an embodiment.

Firstly, six-phase clock signals are provided, and duty cycles of the respective six-phase clock signals are ⅓, but not to limit the present invention. Moreover, each two adjacent sequentially-generated clock signals have a phase difference of 60 degrees. The six-phase clock signals respectively are named as HC1, HC2, HC3, HC4, HC5 and HC6 according to the order of phases. FIG. 5 is the phase relationships among the six-phase clock signals HC1~HC6.

Figure 6A:
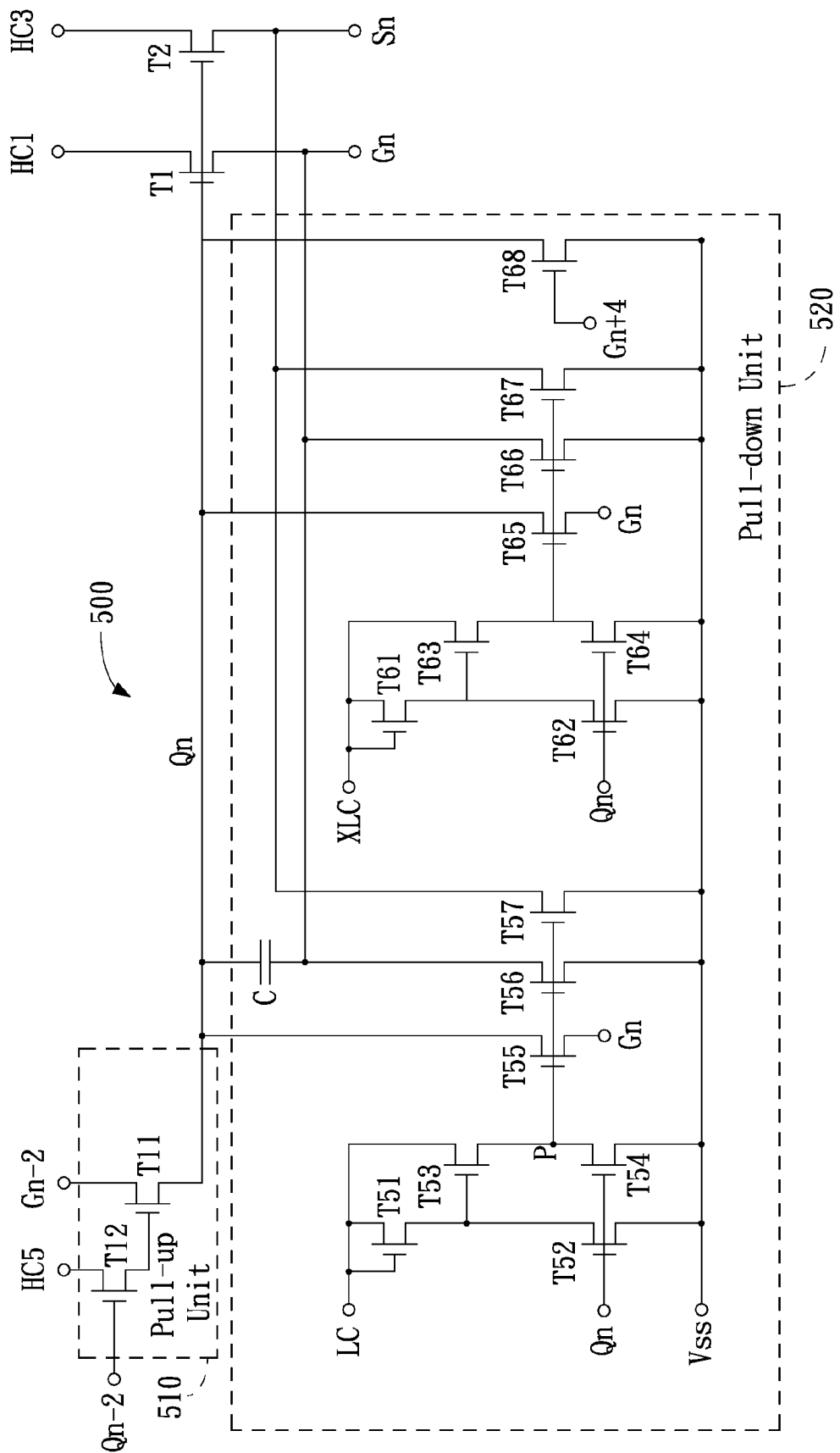
FIGS. 6A and 6B are a schematic circuit diagram of a shift register in a gate driving circuit in accordance with a first embodiment and timing diagrams of associated signals.
Figure 6B:
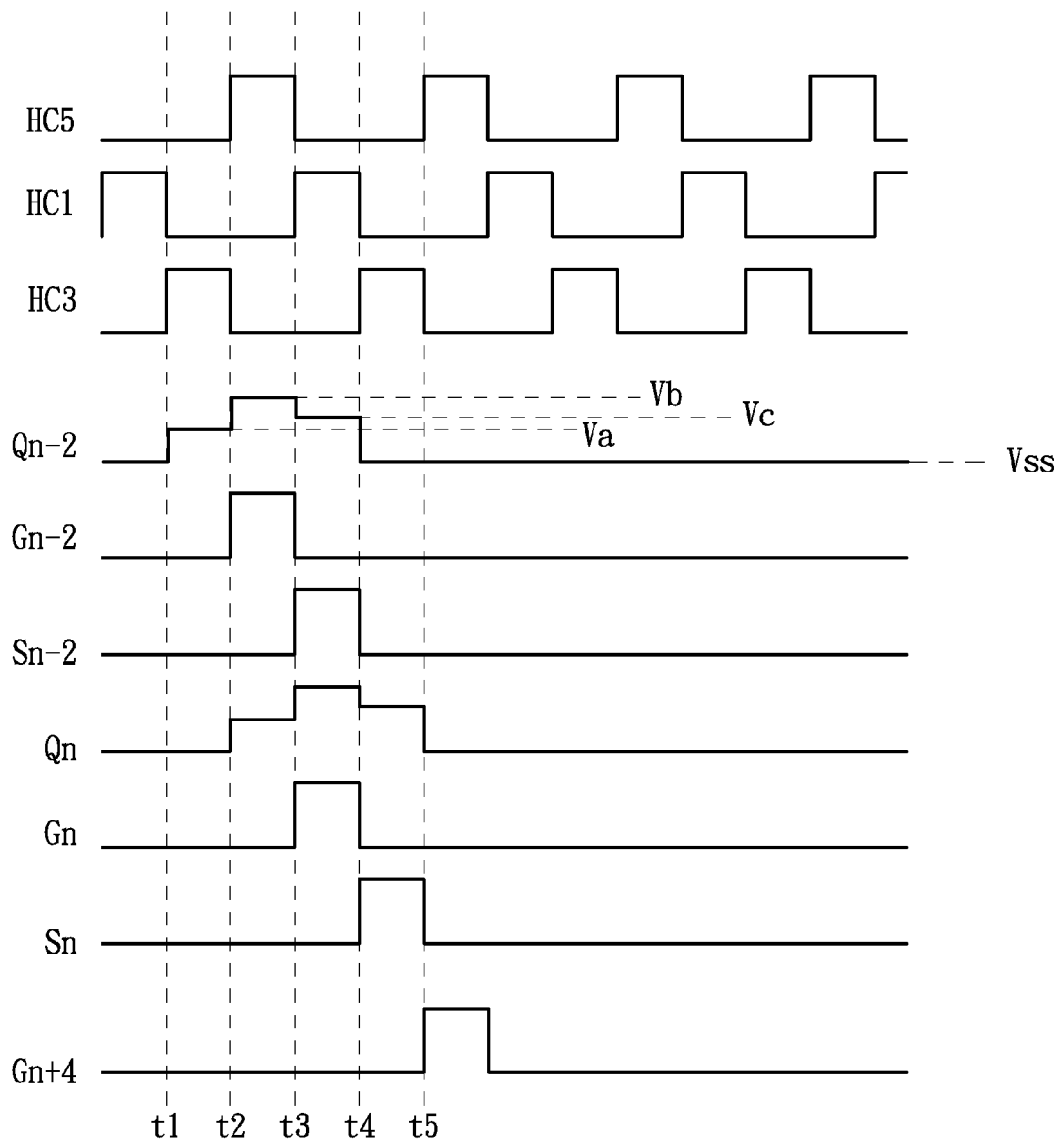

FIGS. 6A and 6B are a schematic circuit diagram of a shift register in a gate driving circuit in accordance with a first embodiment and timing diagrams of associated signals. In particular, an nth shift register is taken as an exemplary shift register in the gate driving circuit of the first embodiment, where n is a positive integer. The nth shift register 500 includes a pull-up unit 510, a pull-down unit 520, a first driving transistor T1 and a second driving transistor T2. Herein, the first driving transistor T1 and the second driving transistor T2 cooperatively constitute a driving unit. A drain of the first driving transistor T1 is electrically coupled to receive the clock signal HC1, and a source of the first driving transistor T1 is for generating a main gate driving signal Gn. A drain of the second driving transistor T2 is electrically coupled to receive the clock signal HC3, and a source of the second driving transistor T2 is for generating a sub gate driving signal Sn.

The pull-up unit 510 includes transistors T12 and T11. A gate of the transistor T12 is electrically coupled to receive a (n−2)th control signal Qn−2, and a drain of the transistor T12 is electrically coupled to receive the clock signal HC5. A gate of the transistor T11 is electrically coupled to a source of the transistor T12, a drain of the transistor T11 is electrically coupled to a (n−2)th main gate driving signal Gn−2, and a source of the transistor T11 is for generating an nth control signal Qn. In short, the pull-up unit 510 is electrically coupled to receive the (n−2)th control signal Qn−2 and the (n−2)th main gate driving signal Gn−2 outputted from the (n−2)th shift register secondly preceding the nth shift register, and further electrically coupled to receive the clock signal HC5. When the pull-up unit 510 is in operation, the nth control signal Qn is pulled up to a first high voltage level to thereby turn on the first driving transistor T1 and the second driving transistor T2.

The pull-down unit 520 is electrically coupled to receive the nth control signal Qn, and when the pull-up unit 510 is not in operation, the pull-down unit 520 maintains the nth control signal Qn at a lowest voltage level. When the pull-up unit 510 starts to be in operation, the pull-down unit 520 would change the nth control signal Qn back to be the lowest voltage level after a predetermined time period and then maintain the nth control signal Qn at the lowest voltage level.

As illustrated in FIG. 6A, LC and XLC in the pull-down unit 520 are complementary clock signals, and Vss is the lowest voltage level. When the control signal Qn is maintained at the level of Vss, transistors T52, T54, T62 and T64 are turned off. When LC is at a logic high (i.e., generally the electronic representation of the binary digit "1") level while XLC is at a logic low (i.e., generally the electronic representation of the binary digit "0") level, transistors T51, T53, T55, T56 and T57 are turned on while the other transistors in the pull-down unit 520 are turned off, and therefore Gn, Sn and Qn all are at the level of Vss. Likewise, when XLC is at a logic high level while LC is at a logic low level, transistors T61, T63, T65, T66 and T67 are turned on while the other transistors in the pull-down unit 520 are turned off, and therefore Gn, Sn and Qn all are at the level of Vss. In other words, when the pull-up unit 510 is not in operation, Qn, Gn and Sn all are maintained at the level of Vss.

Furthermore, when the pull-up unit 510 is in operation and Qn is pulled up to the first high voltage level, the transistors T52, T54, T62, T64 are turned on while the transistors T55, T56, T57, T65, T66 and T67 are turned off. In this situation, after a predetermined time period, by using a (n+4)th main gate driving signal Gn+4 to turn on the transistor T68, the nth control signal Qn can be changed back to be the level of Vss.

The above several paragraphs have described the main function of the pull-down unit 520, it is understood that the pull-down unit 520 can use other different internal circuit structure to achieve the same function. In the following embodiment, a pull-down unit with other internal circuit structure (for example the illustration of FIG. 7) will be described to achieve the effect.

Still referring to FIG. 6B, the mutually non-overlapped clock signals HC5, HC1 and HC3 (i.e., generally duty-on periods thereof are mutually non-overlapped with each other) in the six-phase clock signals are used to the nth shift register, and each adjacent two of the clock signals HC5, HC1 and HC3 have a phase difference of 120 degrees.

Referring back to FIG. 6A, the pull-up unit 510 is electrically coupled to receive the (n−2)th control signal Qn−2 and the (n−2)th main gate driving signal Gn−2 outputted from the (n−2)th shift register secondly preceding the nth shift register, and further electrically coupled to the clock signal HC5 with the most advanced phase.

At the time point t1, the control signal Qn−2 changes from the level of Vss to the first high voltage level Va, the transistor T12 in the pull-up unit 510 is turned on. At the time point t2, the clock signal HC5 jumps to a logic high level to turn on the transistor T11, the (n−2)th main gate driving signal Gn−2 is allowed to be delivered to the source of the transistor T11 to thereby generate the nth control signal Qn, and the nth control signal Qn herein is pulled up to the first high voltage level Va to turn on the first driving transistor T1 and the second driving transistor T2. That is, at the time point t2, the pull-up unit 510 starts to be in operation while the pull-down unit 520 is stopped being in operation.

At the time point t3, the first driving transistor T1 and the second driving transistor T2 are maintained to be turned on, since the clock signal HC1 is at a logic high level while the clock signal HC3 is at a logic low level, the nth main gate driving signal Gn generates a pulse, and further uses the capacitor C in the pull-down unit 520 as a charge pump to pull the nth control signal Qn up to a second high voltage level Vb.

It is understood that, the capacitor C in the pull-down unit 520 can be removed from between the nth control signal Qn and the nth main gate driving signal Gn, so that in this situation the nth control signal Qn still be maintained at the first high voltage level Va instead, but it still can turn on the first driving transistor T1 and the second driving transistor T2.

At the time point t4, the first driving transistor T1 and the second driving transistor T2 are maintained to be turned on, since the clock signal HC1 is at a logic low level while the clock signal HC3 is at a logic high level, the nth sub gate driving signal Sn is generated while the pulse of the nth main gate driving signal Gn is terminated, the nth control signal Qn drops to a third high voltage level Vc.

At the time point t5, the (n+4)th main gate driving signal Qn+4 generates a pulse, the transistor T68 is turned on, the pull-down unit 520 further pulls the nth control signal Qn down to the level of Vss, and the operation of the nth shift register 500 is completed consequently. In the illustrative first embodiment, the predetermined time period is the duration from the time point t2 to the time point t5.

It is understood that, the signal Sn+4, Gn+5, Sn+5 or Gn+6 instead can be used to pull the nth control signal Qn down to the level of Vss, and the predetermined time period correspondingly is changed.

It also can be found from the first embodiment, each of the shift registers can generate the mutually non-overlapped main gate driving signal e.g., Gn and sub gate driving signal e.g., Sn.

Figure 7:
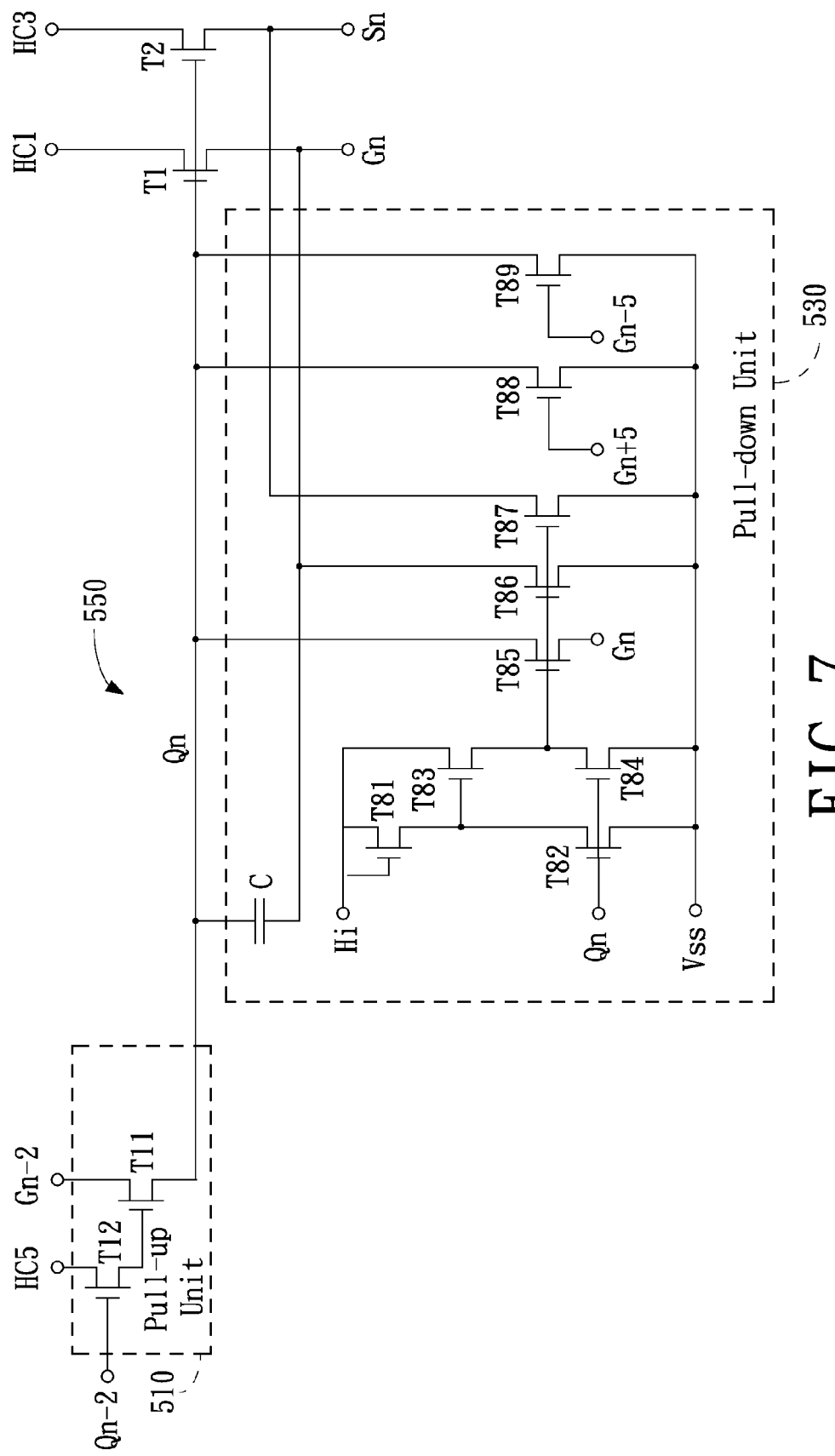
FIG. 7 is a schematic circuit diagram of a shift register in a gate driving circuit in accordance with a second embodiment.

As described above, the pull-down unit 520 in the first embodiment can employ other internal circuit structure instead to achieve the same function. FIG. 7 is a schematic circuit diagram of a shift register 550 in a gate driving circuit in accordance with a second embodiment. A difference of the second embodiment with respect to the first embodiment is the pull-down unit 530, but other circuits are the same as that of the first embodiment.

In particular, Vss in the pull-down unit 530 is the lowest voltage level. When the nth control signal Qn is maintained at the level of Vss, transistors T82 and T84 are turned off. Since the transistor T81 is electrically coupled to a logic high level Hi, transistors T81, T83, T85, T86 and T87 are turned on, and thereby Gn, Sn and Qn all are at the level of Vss. That is, when the pull-up unit 510 is not in operation, Qn, Gn and Sn all are maintained at the level of Vss.

Moreover, when the pull-up unit 510 is in operation and the nth control signal Qn is pulled up to a first high voltage level, the transistors T82, T84 are turned on while the transistors T85, T86, T87 are turned off. In this situation, after a predetermined time period, by using a (n+5)th main gate driving signal Gn+5 to turn on the transistor T88 or by using a (n−5)th main gate driving signal Gn−5 to turn on the transistor T89, the nth control signal Qn can be changed back to the level of Vss.

It is understood that, the other signals in the second embodiment are the same as the illustration of FIG. 6B, and thus will not be repeated hereby.

Figure 8:
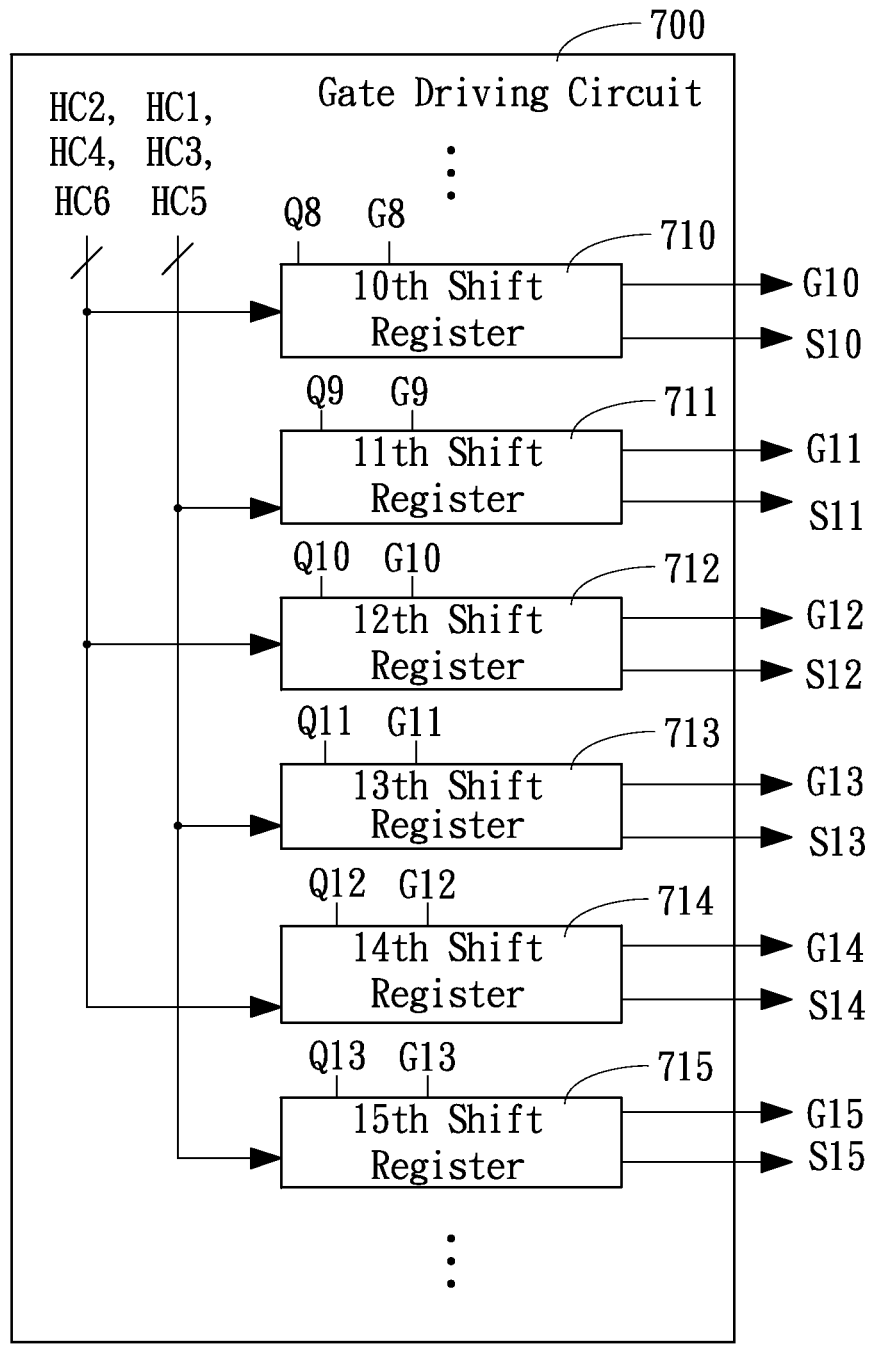
FIG. 8 is a schematic circuit diagram of a gate driving circuit comprised of multiple shift registers as proposed by the first embodiment or the second embodiment.

FIG. 8 is a schematic circuit diagram of a gate driving circuit comprised of multiple shift registers as illustrated by the first embodiment or the second embodiment. In FIG. 8, only $10^{th}$ through $15^{th}$ shift registers 710-715 in the gate driving circuit 700 on a GOA panel are shown for the purpose of illustration, and the other shift registers can be known based on the same design manner.

Clearly, each of the shift registers 710-715 are operated according to a control signal and a main gate driving signal of the secondly preceding shift register cooperative with a suitable combination of clock signals. As illustrated in FIG. 8, the $11^{th}$ shift register 711, the $13^{th}$ shift register 713 and the $15^{th}$ shift register 715 each are electrically coupled to a first group of clock signals HC1, HC3, HC5 in the six-phase clock signals HC1~HC6. The $10^{th}$ shift register 710, the $12^{th}$ shift register 712 and the $14^{th}$ shift register 714 each are electrically coupled to receive a second group of clock signals HC2, HC4, HC6 in the six-phase clock signals HC1~HC6.

The shift registers in the gate driving circuit 700 are arranged from top to bottom, so that the main gate driving signals and the sub gate driving signals are sequentially generated from top to bottom correspondingly. It can be understood that, the shift registers can be arranged from bottom to top instead, so that the main gate driving signals and the sub gate driving signals correspondingly are sequentially generated from bottom to top.

Figure 9A:
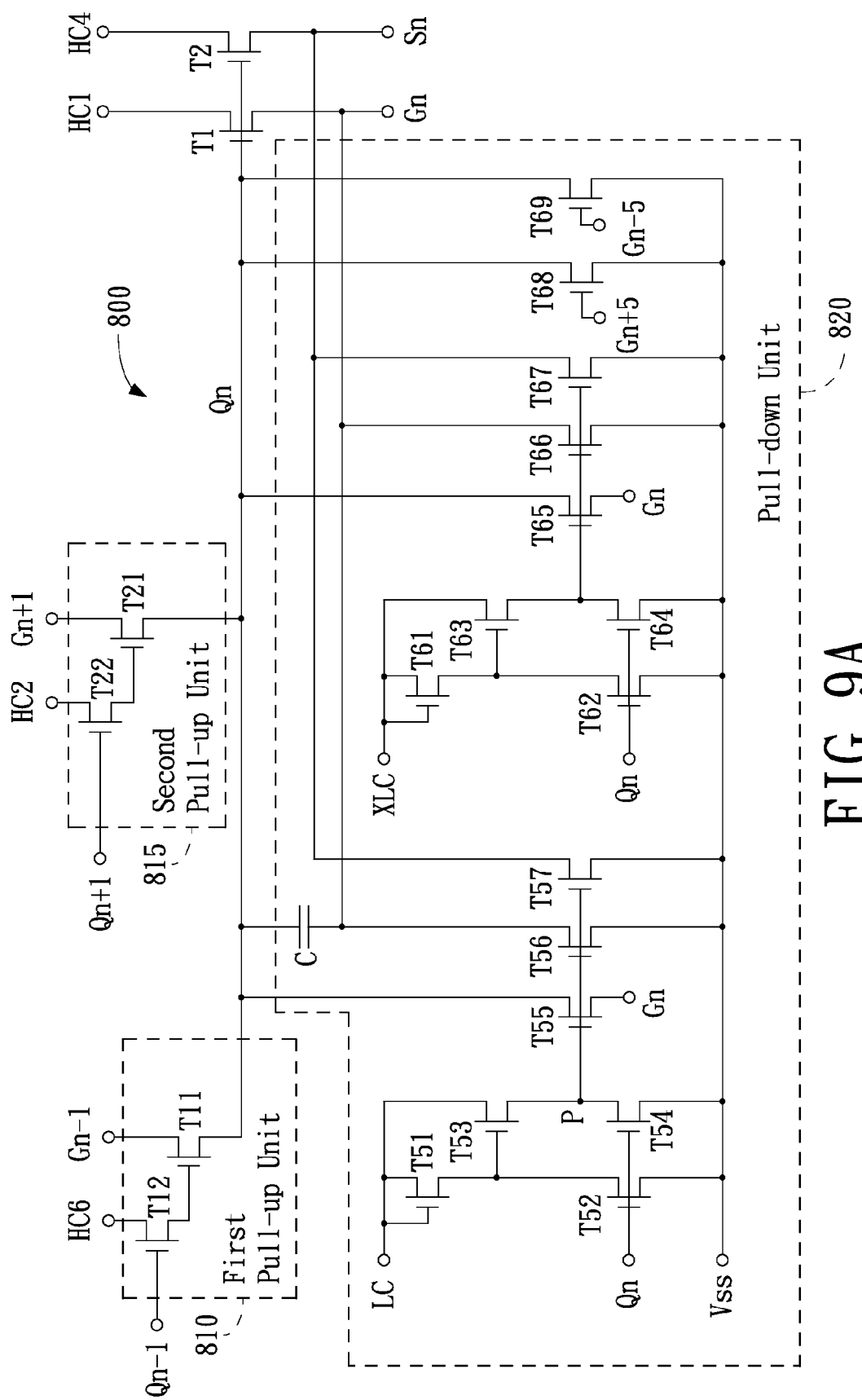
FIGS. 9A and 9B are a schematic circuit diagram of a shift register in a gate driving circuit in accordance with a third embodiment and timing diagrams of associated signals.
Figure 9B:
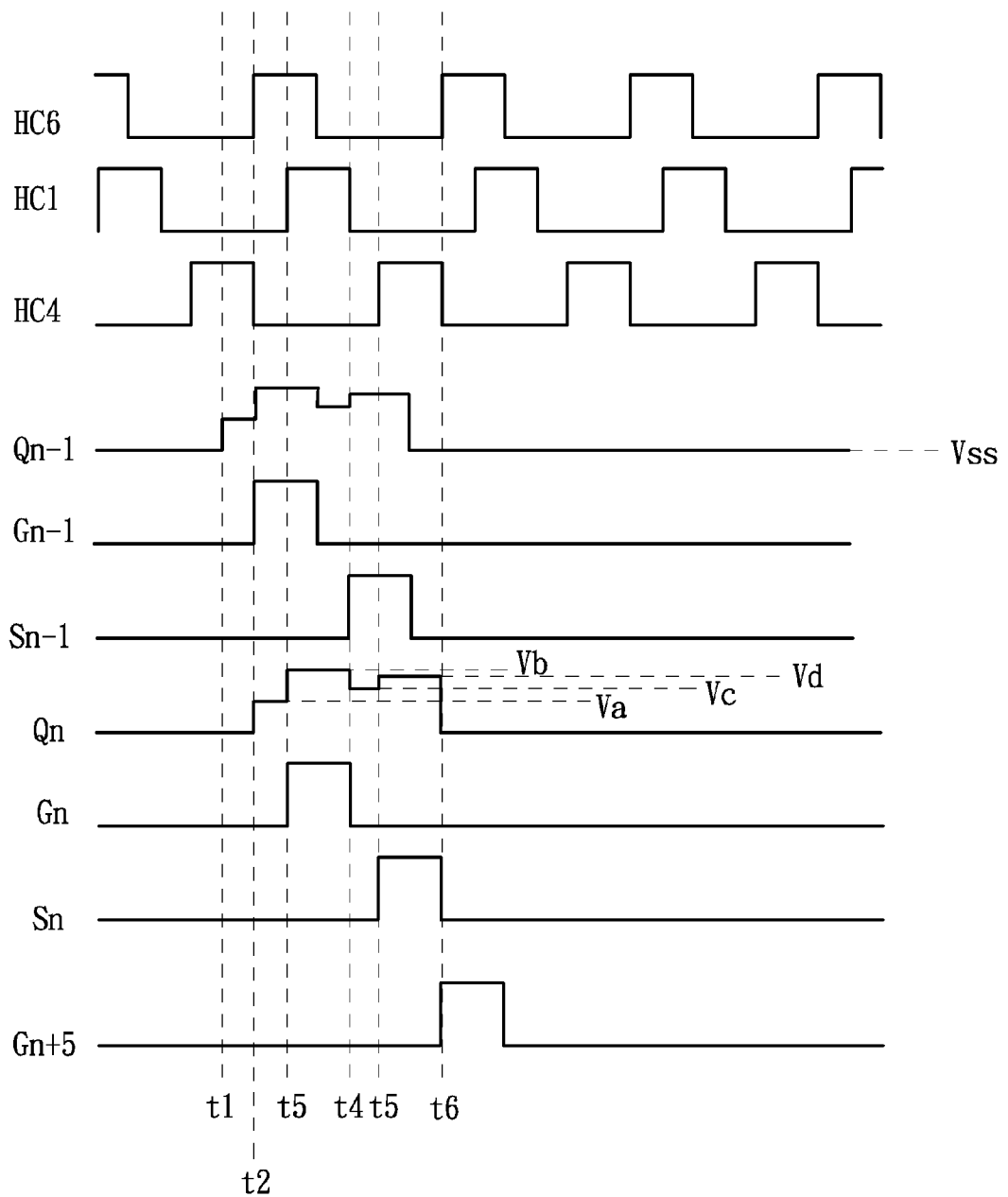

FIGS. 9A and 9B are a schematic circuit diagram of a shift register in a gate driving circuit in accordance with a third embodiment and timing diagrams of associated signals. As illustrated in FIG. 9A, the nth shift register 800 in the shift registers is selectively electrically coupled to the firstly preceding shift register (i.e., (n−1)th shift register) or the firstly succeeding shift register (i.e., (n+1)th shift register).

More specifically, the nth shift register 800 includes a first pull-up unit 810, a second pull-up unit 815, a pull-down unit 820, a first driving transistor T1 and a second driving transistor T2. Herein, the first driving transistor T1 and the second driving transistor T2 cooperatively constitute a driving unit. A drain of the first driving transistor T1 is electrically coupled to receive the clock signal HC1, and a source of the first driving transistor T1 is for generating a main gate driving signal Gn. A drain of the second driving transistor T2 is electrically coupled to the clock signal HC4, and a source of the second driving transistor T2 is for generating a sub gate driving signal Sn.

The first pull-up unit 810 includes transistors T12 and T11. A gate of the transistor T12 is electrically coupled to a (n−1)th control signal Qn−1, and a drain of the transistor T12 is electrically coupled to receive the clock signal HC6. A gate of the transistor T11 is electrically coupled to a source of the transistor T12, a drain of the transistor T11 is electrically coupled to a (n−1)th main gate driving signal Gn−1, and a source of the transistor T11 is for generating an nth control signal Qn. In short, the first pull-up unit 810 is electrically coupled to receive the (n−1)th control signal Qn−1 and the (n−1)th main gate driving signal Gn−1 outputted from the firstly preceding shift register (i.e., the (n−1)th shift register), and further electrically coupled to receive the clock signal HC6. When the first pull-up unit 810 is in operation, the nth control signal Qn would be pulled up to a first high voltage level to turn on the first driving transistor T1 and the second driving transistor T2. When the nth shift register 800 in the third embodiment only operates the first pull-up unit 810, the gate driving circuit comprised of such shift registers would sequentially generate main gate driving signals and sub gate driving signals from top to bottom.

The second pull-up unit 815 includes transistors T22 and T21. A gate of the transistor T22 is electrically coupled to receive a (n+1)th control signal Qn+1, and a drain of the transistor T22 is electrically coupled to receive the clock signal HC2. A gate of the transistor T21 is electrically coupled to a source of the transistor T22, a drain of the transistor T21 is electrically coupled to a (n+1)th main gate driving signal Gn+1, and a source of the transistor T21 is for generating the nth control signal Qn. In short, the second pull-up unit 815 is electrically coupled to the (n+1)th control signal Qn+1 and the (n+1)th main gate driving signal Gn+1 outputted from the firstly succeeding shift register (i.e., the (n+1)th shift register), and further electrically coupled to receive the clock signal HC2. When the second pull-up unit 815 is in operation, the nth control signal Qn would be pulled up to the first high voltage level to turn on the first driving transistor T1 and the second driving transistor T2. When the nth shift register 800 in the third embodiment only operates the second pull-up unit 815, the gate driving circuit comprised of such shift registers would sequentially generate main gate driving signal and sub gate driving signals from bottom to top.

The pull-down unit 820 is electrically coupled to receive the nth control signal Qn. When the first pull-up unit 810 or the second pull-up unit 815 is not in operation, the pull-down unit 820 would make the nth control signal Qn be maintained at a lowest voltage level. When the first pull-up unit 810 or the second pull-up unit 815 starts to be in operation, the pull-down unit 820 would change the nth control signal Qn back to the lowest voltage level after a predetermined time period and then maintain the nth control signal Qn at the lowest voltage level.

As illustrated in FIG. 9A, LC and XLC in the pull-down unit 820 are a group of complementary clock signals, and Vss is the lowest voltage level. When the nth control signal Qn is maintained at the level of Vss, transistors T52, T54, T62, T64 are turned off. When LC is at a logic high level while XLC is at a logic low level, transistors T51, T53, T55, T56, T57 are turned on, and the other transistors in the pull-down unit 820 are turned off, and thereby Gn, Sn and Qn are at the level of Vss. Likewise, when XLC is at a logic high level while LC is at a logic low level, transistors T61, T63, T65, T66, T67 are turned on, while the other transistors in the pull-down unit 820 are turned off, and thereby Gn, Sn and Qn are at the level of Vss. That is, when the first pull-up unit 810 or the second pull-up unit 815 is not in operation, Qn, Gn and Sn all are maintained at the level of Vss.

Furthermore, when the first pull-up unit 810 or the second pull-up unit 815 is in operation, the nth control signal Qn is pulled up to the first high voltage level, the transistors T52, T54, T62, T64 are turned on while the transistors T55, T56, T57, T65, T66, T67 are turned off. In this situation, after a predetermined time period, by using a (n+5)th main gate driving signal Gn+5 to turn on the transistor T68, or by using a (n−5)th main gate driving signal Gn−5 to turn on the transistor T69, the control signal Qn can be changed back to the level of Vss.

In other words, in the case of using the (n+5)th main gate driving signal Gn+5 to turn on the transistor T68, the gate driving circuit in accordance with the third embodiment sequentially generates main gate driving signals and sub gate driving signal from top to bottom. Whereas, in the case of using the (n−5)th main gate driving signal Gn−5 to turn on the transistor T69, the gate driving circuit in accordance with the third embodiment sequentially generates main gate driving signals and sub gate driving signals from bottom to top.

Likewise, the pull-down unit 820 in FIG. 9A can use other internal circuit structure (for example the illustration of FIG. 10) instead to achieve the same function.

FIG. 9B is timing diagrams of multiple signals associated with the gate driving circuit sequentially generating main gate driving signals and sub gate driving signals from top to bottom. Herein, the first pull-up unit 810 is used for achieving the electrical connection of each adjacent two of the shift registers in the gate driving circuit.

As illustrated in FIG. 9B, the clock signals HC6, HC2 (not shown), HC1 and HC4 in the six-phase clock signals are selected for the nth shift register. The clock signal HC6 is phase-advanced with respect to the clock signal HC1 by 60 degrees, the clock signal HC1 is phase-advanced with respect to the clock signal HC4 by 180 degrees, and the clock signal HC2 is phase-delayed with respect to the clock signal HC1 by 60 degrees (see FIG. 5). Moreover, the clock signal HC1 and the clock signal HC4 are mutually non-overlapped with each other, i.e., generally duty-on periods of the clock signals HC1, HC4 are mutually non-overlapped with each other.

Referring to FIGS. 9A and 9B together, the first pull-up unit 810 in the nth shift register is electrically coupled to receive the (n−1)th control signal Qn−1 and the (n−1)th main gate driving signal Gn−1 outputted from the firstly preceding shift register (i.e., the (n−1)th shift register), and further electrically coupled to receive the clock signal HC6 with the most advanced phase.

At the time point t1, since the clock signal HC5 (not shown) makes the (n−1)th control signal Qn−1 be changed from the level of Vss to the first high voltage level Va, the transistor T12 in the first pull-up unit 810 is turned on. At the time point t2, the clock signal HC6 is at a logic high level, the transistor T11 is turned on so that the (n−1)th main gate driving signal Gn−1 is allowed to be delivered to the source of the transistor T11 to thereby generate the nth control signal Qn, herein the nth control signal Qn is pulled up to the first high voltage level to turn on the first driving transistor T1 and the second driving transistor T2. That is, at the time point t2, the first pull-up unit 810 starts to be in operation, and the pull-down unit 820 is stopped being in operation.

At the time point t3, the first driving transistor T1 and the second driving transistor T2 are maintained to be turned on, since the clock signal HC1 is at a logic high level while the clock signal HC4 is at a logic low level, the nth main gate driving signal Gn generates a pulse and uses the capacitor C in the pull-down unit 820 as a charge pump to pull the nth control signal Qn up to a second high voltage level Vb.

At the time point t4, the first driving transistor T1 and the second driving transistor T2 are maintained to be turned on, since the clock signal HC1 is at a logic low level while the clock signal HC4 also is at the logic low level, the nth main gate driving signal Gn terminates the pulse and makes the nth control signal Qn be dropped to a third high voltage level Vc.

At the time point t5, the first driving transistor T1 and the second driving transistor T2 are maintained to be turned on, since the clock signal HC1 is at the logic low level while the clock signal HC4 is at a logic high level, the nth sub gate driving signal Sn generates a pulse and further uses the capacitor C in the pull-down unit 820 as a charge pump to pull the nth control signal Qn up to a fourth high voltage level Vd.

At the time point t6, a (n+5)th main gate driving signal Gn+5 generates a pulse to control the pull-down unit 820 to pull the control signal Qn down to the level of Vss. Meanwhile, the nth sub gate driving signal Sn terminates the pulse. After the time point t6, the operation of the nth shift register is completed consequently. Accordingly, the predetermined time period is the duration from the time point t2 to the time point t6.

It is understood that, the signal Sn+2, Gn+6 or Sn+3 instead can be used to pull the nth control signal Qn down to the level of Vss, and the predetermined time period would be changed correspondingly.

It also can be found from the above third embodiment, each of the shift registers can generate mutually non-overlapped main gate driving signal e.g., Gn and sub gate driving signal e.g., Sn.

Likewise, a gate driving circuit using the second pull-up unit 815 to achieve the electrical connection of each adjacent two of its shift registers and sequentially generating main gate driving signals and sub gate driving signals from bottom to top also can be realized by the third embodiment. That is, the clock signals HC1, HC5, HC6, HC3 in the six-phase clock signals are selected instead for the nth shift register 800 as illustrated in FIG. 9A. The clock signal HC5 is phase-advanced with respect to the clock signal HC6 by 60 degrees, the clock signal HC6 is phase-advanced with respect to the clock signal HC3 by 180 degrees, the clock signal HC1 is phased-delayed with respect to the clock signal HC6 by 60 degrees, and the clock signals HC3, HC6 are mutually non-overlapped with each other (i.e., generally duty-on periods of HC3, HC6 are mutually non-overlapped with each other). Moreover, the drain of the first driving transistor T1 is electrically coupled to receive the clock signal HC6, the drain of the second driving transistor T2 is electrically coupled to receive the clock signal HC3, the drain of the transistor T22 is electrically coupled to receive the clock signal HC5, and the drain of the transistor T12 is electrically coupled to receive the clock signal HC1. The primary operation principle is same as that when the first pull-up unit 810 is used, and thus will not be repeated hereby.

Figure 10:
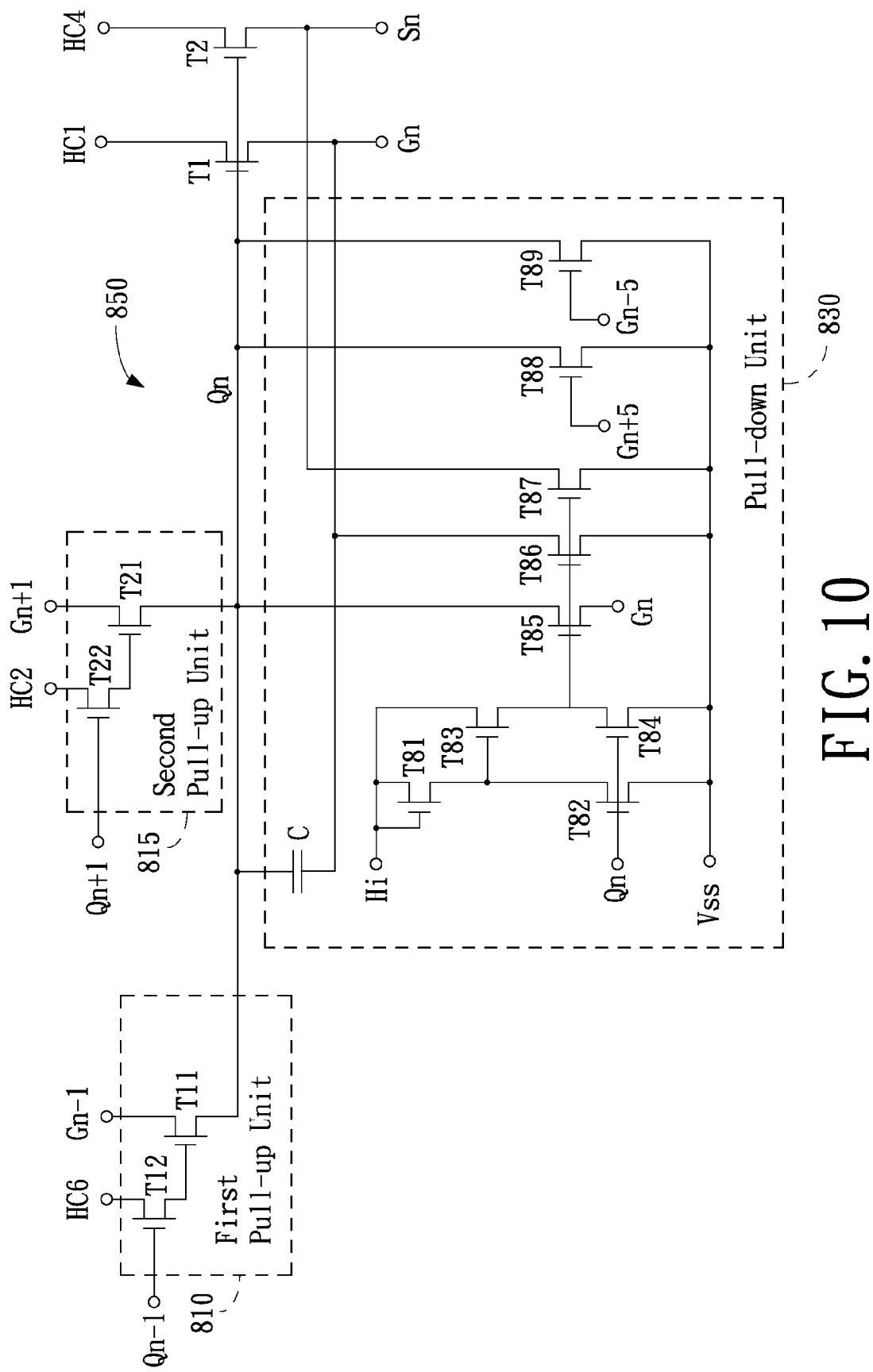
FIG. 10 is a schematic circuit diagram of a shift register in a gate driving circuit in accordance with a fourth embodiment.

As described above, the pull-down unit 820 in the third embodiment may use other internal circuit structure instead to achieve the same function. FIG. 10 is a schematic circuit diagram of a shift register 850 in a gate driving circuit in accordance with a fourth embodiment. A difference of the fourth embodiment with respect to the above third embodiment is the pull-down unit 830, but the other circuits are the same as that in the third embodiment.

As illustrated in FIG. 10, Vss in the pull-down unit 830 is the lowest voltage level. When the nth control signal Qn is maintained at the level of Vss, transistors T82, T84 are turned off. Since the transistor T81 is electrically coupled to receive a logic high level Hi, transistors T81, T83, T85, T86, T87 are turned on, so that Gn, Sn and Qn are at the level of Vss. That is, when the first pull-up unit 810 or the second pull-up unit 815 is not in operation, Qn, Gn and Sn all are maintained at the level of Vss.

Moreover, when the first pull-up unit 810 or the second pull-up unit 815 is in operation, the nth control signal Qn is pulled up to the first high voltage level, transistors T82, T84 are turned on while transistors T85, T86, T87 are turned off. In this situation, after a predetermined time period, by using the (n+5)th main gate driving signal Gn+5 to turn on the transistor T88 or by using the (n−5)th main gate driving signal Gn−5 to turn on the transistor T89, the nth control signal Qn can be changed back to the level of Vss.

It is understood that, timing diagrams of the other associated signals in the fourth embodiment are the same as that as illustrated in FIG. 9B, and thus will not be repeated hereby.

Figure 11:
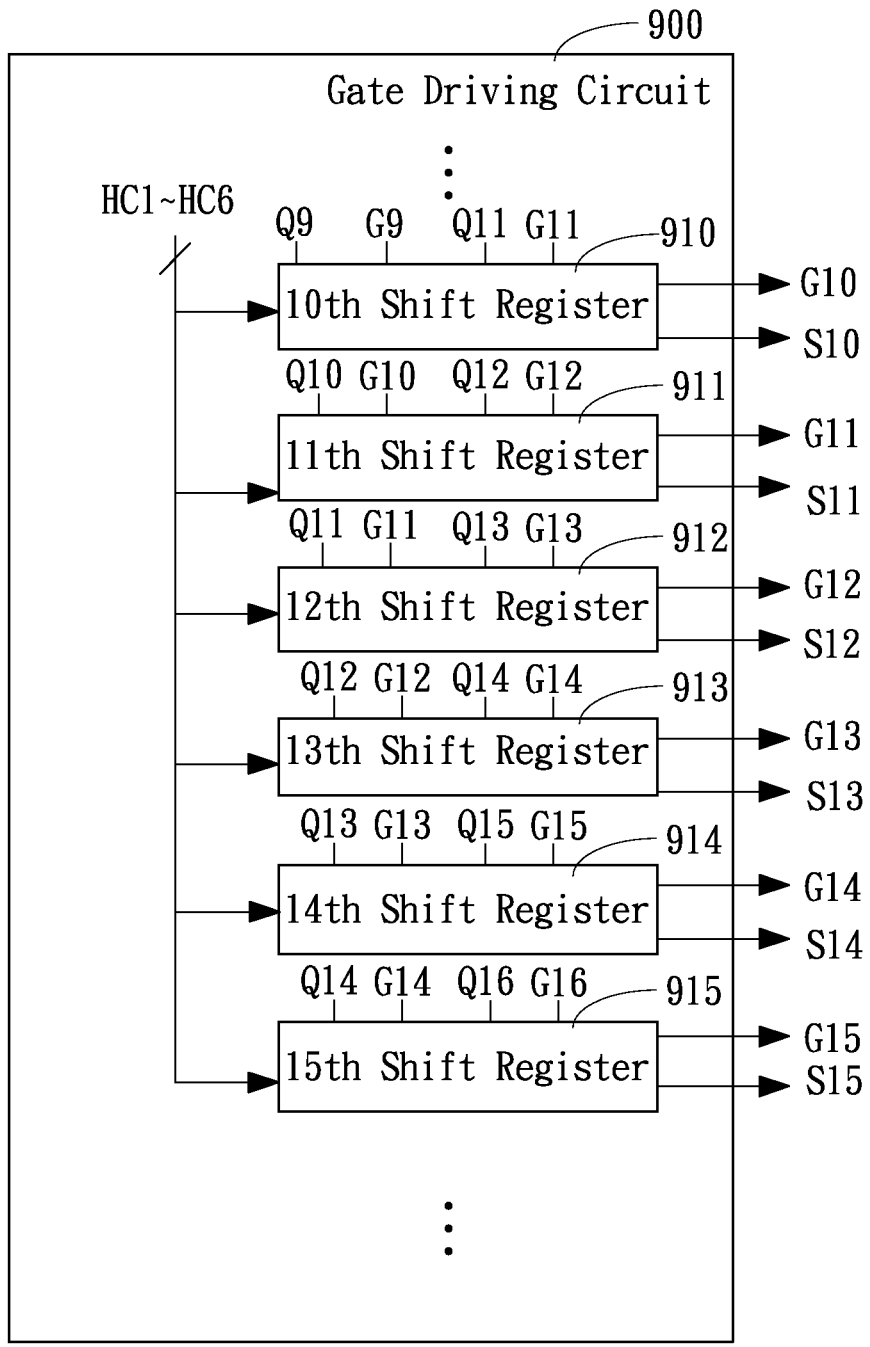
FIG. 11 is a schematic circuit diagram of a gate driving circuit comprised of multiple shift registers as illustrated in the third embodiment or the fourth embodiment.

FIG. 11 is a schematic circuit diagram of a gate driving circuit comprised of multiple shift registers as illustrated in the third embodiment or the fourth embodiment. In particular, in FIG. 11, only $10^{th}$ through $15^{th}$ shift registers 910-915 of the gate driving circuit 900 on a GOA panel are shown for the purpose of illustration, and the other shift registers can be known based on the same design manner.

Clearly, each of the shift registers 910-915 is operated according to a control signal and a main gate driving signal outputted from the firstly preceding shift register thereof cooperative with three mutually non-overlapped clock signals in the six-phase clock signals HC1~HC6.

In summary, an advantage of the disclosure is to provide a gate driving circuit on array applied to a display panel with charge sharing pixel structure (herein, such display panel is termed as GOA panel). The gate driving circuit on the GOA panel includes multiple shift registers, each of the shift registers can output mutually non-overlapped main gate driving signal and sub gate driving signal. Furthermore, the gate driving circuit has the advantages of simplified circuit structure and circuit layout. Herein, it is indicated that, for a transistor, the drain and the source thereof generally have the same structure and thus interchangeable in use, and the distinguish between the drain and the source only is based on the viewer's point.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A gate driving circuit adapted to receive multi-phase clock signals, the gate driving circuit comprising a plurality of shift registers, and an nth shift register in the shift registers comprising:
- a driving unit, comprising:
  - a first driving transistor, including a gate directly coupled to receive an nth control signal, a drain directly coupled to receive a first clock signal of the multi-phase clock signals, and a source for outputting an nth main gate driving signal; and
  - a second driving transistor, including a gate directly coupled to receive the nth control signal, a drain directly coupled to receive a second clock signal of the multi-phase clock signals, and a source for outputting an nth sub gate driving signal;
- a pull-up unit, electrically coupled to receive a (n−2)th control signal and a (n−2)th main gate driving signal outputted from a (n−2)th shift register in the shift registers secondly preceding the nth shift register, and further electrically coupled to receive a third clock signal of the multi-phase clock signals, wherein when the pull-up unit is in operation, the nth control signal is controlled to turn on the driving unit; and
- a pull-down unit, electrically coupled to receive the nth control signal, the nth main gate driving signal and the nth sub gate driving signal, wherein the pull-down unit is in operation after a predetermined time period of the pull-up unit starting to be in operation, to thereby control the nth control signal to turn off the driving unit;
- wherein the third clock signal is phase-advanced with respect to the first clock signal, the first clock signal is phase-advanced with respect to the second clock signal, and the first clock signal, the second clock signal and the third clock signal are mutually non-overlapped with each other.

2. The gate driving circuit according to claim 1, wherein the third clock signal is phase-advanced with respect to first clock signal by 120 degrees, and the first clock signal is phase-advanced with respect to the second clock signal by 120 degrees.

3. The gate driving circuit according to claim 1, wherein when the first driving transistor and the second driving transistor are turned on, the nth main gate driving signal is generated by the first driving transistor according to the first clock signal, and the nth sub gate driving signal is generated by the second driving transistor according to the second clock signal.

4. The gate driving circuit according to claim 1, wherein when the first driving transistor and the second driving transistor are turned off, the pull-down unit provides a lowest voltage level to the nth main gate driving signal and the nth sub gate driving signal.

5. The gate driving circuit according to claim 1, wherein the pull-up unit comprises:
- a third transistor, including a gate electrically coupled to receive the (n−2)th control signal, and a drain electrically coupled to receive the third clock signal; and
- a fourth transistor, including a gate electrically coupled to a source of the third transistor,
- a drain electrically coupled to receive (n−2)th main gate driving signal, and a source for outputting the nth control signal.

6. The gate driving circuit according to claim 5, wherein when the (n−2)th control signal turns on the third transistor, the fourth transistor is turned on according to the third clock signal, and thereby the pull-up unit is in operation according to the (n−2)th main gate driving signal to turn on the driving unit.

7. A gate driving circuit adapted to receive multi-phase clock signals, the gate driving circuit comprising a plurality of shift registers, and an nth shift register in the shift registers comprising:
- a driving unit, comprising:
  - a first driving transistor, including a gate directly coupled to receive an nth control signal, a drain directly coupled to receive a first clock signal of the multi-phase clock signals, and a source for outputting an nth main gate driving signal; and
  - a second driving transistor, including a gate directly coupled to receive the nth control signal, a drain directly coupled to receive a second clock signal of the multi-phase clock signals, and a source for outputting an nth sub gate driving signal;
- a first pull-up unit, electrically coupled to receive a (n−1)th control signal and a (n−1)th main gate driving signal outputted from a (n−1)th shift register firstly preceding the nth shift register, and further electrically coupled to receive a third clock signal of the multi-phase clock signals, wherein when the first pull-up unit is in operation, the nth control signal is controlled to turn on the driving unit;
- a second pull-up unit, electrically coupled to receive a (n+1)th control signal and a (n+1)th main gate driving signal outputted from a (n+1)th shift register firstly succeeding the nth shift register, and further electrically coupled to receive a fourth clock signal of the multi-phase clock signals, wherein when the second pull-up unit is in operation, the nth control signal is controlled to turn on the driving unit; and
- a pull-down unit, electrically coupled to receive the nth control signal, the nth main gate driving signal and the nth sub gate driving signal, wherein the pull-down is in operation after a predetermined time period of each of the first and second pull-up units starting to be in operation, to thereby control the nth control signal to turn off the driving unit;
- wherein the third clock signal is phase-advanced with respect to the first clock signal, the first clock signal is phase-advanced with respect to the second clock signal, the fourth clock signal is phase-delayed with respect to the first clock signal, and the first clock signal and the second clock signal are mutually non-overlapped with each other.

8. The gate driving circuit according to claim 7, wherein the third clock signal is phase-advanced with respect to the first clock signal by 60 degrees, the first clock signal is phase-advanced with respect to the second clock signal by 180 degrees, and the fourth clock signal is phase-delayed with respect to the first clock signal by 60 degrees.

9. The gate driving circuit according to claim 7, wherein when the first driving transistor and the second driving transistor are turned on, the nth main gate driving signal is generated by the first driving transistor according to the first clock signal, and the nth sub gate driving signal is generated by the second driving transistor according to the second clock signal.

10. The gate driving circuit according to claim 7, wherein when the first driving transistor and the second driving transistor are turned off, the pull-down unit provides a lowest voltage level to the nth main gate driving signal and the nth sub gate driving signal.

11. The gate driving circuit according to claim 7, wherein the first pull-up unit comprises:
- a third transistor, including a gate electrically coupled to receive the (n−1)th control signal, and a drain electrically coupled to receive the third clock signal; and
- a fourth transistor, including a gate electrically coupled to a source of the third transistor, a drain electrically coupled to receive the (n−1)th main gate driving signal, and a source for generating the nth control signal.

12. The gate driving circuit according to claim 11, wherein when the (n−1)th control signal turns on the third transistor, the fourth transistor is turned on according to the third clock signal, and thereby the first pull-up unit is in operation according to the (n−1)th main gate driving signal to turn on the driving unit.

13. The gate driving circuit according to claim 7, wherein the second pull-up unit comprises:
- a fifth transistor, including a gate electrically coupled to receive the (n+1)th control signal, and a drain electrically coupled to receive the fourth clock signal; and
- a sixth transistor, including a gate electrically coupled to a source of the fifth transistor, a drain electrically coupled to receive the (n+1)th main gate driving signal, and a source for generating the nth control signal.

14. The gate driving circuit according to claim 13, wherein when the (n+1)th control signal turns on the fifth transistor, the sixth transistor is turned on according to the fourth clock signal, and thereby the second pull-up unit is in operation according to the (n+1)th main gate driving signal to turn on the driving unit.

* * * * *